US012729425B2

(12) United States Patent
You

(10) Patent No.: US 12,729,425 B2
(45) Date of Patent: Sep. 8, 2026

(54) ROTARY CATHODE END BLOCK

(71) Applicant: NCS VACUUM TECHNOLOGY (HEFEI) CO., LTD., Anhui (CN)

(72) Inventor: Jinshan You, Anhui (CN)

(73) Assignee: NCS VACUUM TECHNOLOGY (HEFEI) CO., LTD., Anhui (CN)

( * ) Notice: Subject to any disclaimer, the term of this patent is extended or adjusted under 35 U.S.C. 154(b) by 275 days.

(21) Appl. No.: 18/690,746

(22) PCT Filed: Aug. 5, 2023

(86) PCT No.: PCT/CN2023/111356
§ 371 (c)(1),
(2) Date: Mar. 11, 2024

(87) PCT Pub. No.: WO2024/041353
PCT Pub. Date: Feb. 29, 2024

(65) Prior Publication Data

US 2025/0137115 A1 May 1, 2025

(30) Foreign Application Priority Data

Aug. 26, 2022 (CN) ......................... 202211032345.6

(51) Int. Cl.
*H01J 37/34* (2006.01)
*C23C 14/34* (2006.01)

(52) U.S. Cl.
CPC ........ *C23C 14/3407* (2013.01); *H01J 37/342* (2013.01)

(58) Field of Classification Search
None
See application file for complete search history.

(56) References Cited

U.S. PATENT DOCUMENTS

2006/0049043 A1 3/2006 Matuska et al.
2016/0343550 A1* 11/2016 Siegert .................... F16C 19/24
2018/0048104 A1* 2/2018 Saitou .................... H01R 39/40

FOREIGN PATENT DOCUMENTS

CN 201323136 10/2009
CN 102296273 12/2011
(Continued)

OTHER PUBLICATIONS

"International Search Report (Form PCT/ISA/210) with English translation thereof and Written Opinion of the International Searching Authority (Form PCT/ISA/237) of PCT/CN2023/111356", mailed on Nov. 22, 2023, pp. 1-9.

(Continued)

*Primary Examiner* — Jason Berman
(74) *Attorney, Agent, or Firm* — JCIPRNET

(57) ABSTRACT

A rotary cathode end block in this application comprises an end case body. A conductive drive shaft is rotatably installed in the end case body through a bearing, and one end of the drive shaft penetrates from the end case body and is fixedly connected with a target installation flange. A conductive central support is fixedly connected to the end case body. The central support is integrally formed with a connection shaft. One end of the connection shaft coaxially passes through the drive shaft and the target installation flange. A non-rotating electrical contact is set on the connection shaft. The central support is electrically connected with the electrical contact. The electrical contact is in contact with the drive shaft, and the contact surface between which is cone-shaped. The advantages of this application are larger transmission power and more reliable structure.

19 Claims, 4 Drawing Sheets

(56) References Cited

FOREIGN PATENT DOCUMENTS

| | | |
|---|---|---|
| CN | 105401126 | 3/2016 |
| CN | 206157215 | 5/2017 |
| CN | 115287618 | 11/2022 |
| CN | 217922288 | 11/2022 |

OTHER PUBLICATIONS

"First Office Action of China Counterpart Application", with English translation thereof, issued on Jun. 24, 2025, pp. 1-9.
"Second Office Action of China Counterpart Application", with English translation thereof, issued on Nov. 12, 2025, pp. 1-13.
"Official Decision of Rejection of China Counterpart Application", with English translation thereof, issued on Mar. 9, 2026, pp. 1-19.

* cited by examiner

ROTARY CATHODE END BLOCK

CROSS-REFERENCE TO RELATED APPLICATION

This application is a 371 of international application of PCT application serial no. PCT/CN2023/111356, filed on Aug. 5, 2023, which claims the priority benefit of China application no. 202211032345.6, filed on Aug. 26, 2022. The entirety of each of the above mentioned patent applications is hereby incorporated by reference herein and made a part of this specification.

TECHNICAL FIELD

The application relates to the field of vacuum coating equipment, and in particular, to a rotary cathode end block.

BACKGROUND ART

The large-area vacuum coating equipment of magnetron sputtering and rotating is characterized by the rotating state of the target in the process of working, with the high target utilization rate and the clean target surface with the small number of arcs. Because the target is in a rotating state, the vacuum coating equipment must have the functions of dynamic transmission of electricity, cooling water dynamic sealing and vacuum dynamic sealing.

In recent years, the development of the industry has increasingly strong demand for long-term stable operation of high power. Therefore, in the vacuum coating equipment, the rotary magnetron sputtering cathode is generally used to achieve the dynamic transmission of electric power, the dynamic seal of the cooling water and the dynamic seal of the vacuum parts. Accordingly, the rotary magnetron sputtering cathode has become the core component of the vacuum coating equipment.

The carbon brush is used to achieve dynamic rotation transmission in existing rotating magnetron sputtering cathode. That is, the electrical ring on the drive shaft that drives the target to rotate is electrically contacted by a carbon brush, and by which the target is connected to the external power supply through the carbon brush. The characteristics of carbon brush are that the structure is complex, the electric contact area is small, it cannot transmit a larger current, and the carbon powder generated by wear will be damaged to the dynamic sealing and insulation of the end block.

SUMMARY OF THE APPLICATION

In order to solve the technical problems existing in the background technology, this application proposes a rotary cathode end block, to solve the problem of small transmission currents in the power transmission parts of the existing rotating magnetic sputtering cathode.

A rotary cathode end block in this application comprises an end case body. A conductive drive shaft is rotatably installed in the end case body through a bearing, and one end of the drive shaft penetrates from the end case body and is fixedly connected with a target installation flange.

A conductive central support is fixedly connected to the end case body. The central support is integrally formed with a connection shaft. One end of the connection shaft coaxially passes through the drive shaft and the target installation flange, and is connected with a bar magnet.

A non-rotating electrical contact is coaxially set on the connection shaft. The central support is electrically connected with the electrical contact. The central support and the electrical contact are connected through a conductive band. The electrical contact is in contact with the drive shaft, and the contact surface between which is cone-shaped.

There is a conductive band connected between the central support and the electrical contact.

A spring between the electrical contact and the central support is set on the connection shaft a force is provided through the spring to maintain close contact between the electrical contact and the drive shaft.

The connection shaft is configured with a pin hole along its radial orientation. A spacing pin is installed in the pin hole, both ends of the spacing pin are extended out from the pin hole. A guide groove is arranged on the electrical contact along its axial direction. The electrical contact slidable fits with the spacing pin through the guide groove.

The electrical contact is configured with a conical surface at its end. The drive shaft is formed with a conical hole portion inside. The electrical contact is arranged in the drive shaft, and the conical surface at the end of the electrical contact is in contact with the conical inner wall of the conical hole portion in the drive shaft.

The end case body is conductive, and the end case body is fixedly connected with a conductive plate. The conductive plate is fixedly connected with an insulating plate and a connecting block. The insulating plate is fixedly connected with an end base. The connecting block passes through the insulating plate and the end base.

The shaft body of the drive shaft is wound with a belt, which is penetrated from the end case body and connected to an external motor through a pulley.

The rotary cathode end block also comprises a workbench, the end base is fixedly connected to the workbench, and the belt and the connecting block pass through the workbench.

A vacuum rotary dynamic seal is installed between one end of the drive shaft extending out of the end case body and the end case body.

The outer edge of the target installation flange is installed with a first target locking clamp.

The rotary cathode end block also comprises a head for mounting at one end of the target.

Two water joints fixedly connected on the end case body. There is a circumferential gap between the drive shaft and the connection shaft, and one of the water joints is communicated with the circumferential gap. A first channel communicated with the circumferential gap is arranged on the drive shaft, and a through hole communicate with the first channel is arranged on the target installation flange. There is a second channel in the head. The connection shaft is a hollow shaft. The circumferential surface of the central support is provided with a hole communicated with the interior of the connection shaft, and another water joint is communicated with the hole. A cooling water dynamic seal is installed between the end of the drive shaft located inside the end case body and the inner wall of the end case body.

The outer edge of the head is installed with a second target locking clamp.

The rotating cathode end block also comprises a support end, and the head can be rotated and installed on the support end.

A rotary cathode end block proposed in this application, used to rotate a target with a bar magnet inside and electrically connect it to an external power supply, comprises a drive shaft used to connect a target to drive the target to rotate. The drive shaft is made of conductive material. The rotary cathode end block also comprises an electrical contact for electrical connection. One of the electrical contact and the drive shaft is formed with a conical hole portion, and the other one of the electrical contact and the drive shaft is formed with a conical surface. The electric contact between the electrical contact and the drive shaft is maintained by the conical surface and the conical hole portion, and the electrical contact does not rotate with the drive shaft. The external power supply is electrically connected to the target through the electrical contact and the drive shaft in turn.

The end of the electrical contact is shaped with a conical surface, and the drive shaft is hollow and shaped with a conical hole portion. The electrical contact is arranged in the drive shaft, and the conical surface of the electrical contact is maintained electric contact with the wall of the conical hole portion of the drive shaft.

The electrical contact and the drive shaft are made of conductive metal materials, and the material hardness of the drive shaft is greater than the material hardness of the electrical contact.

The rotary cathode end block also comprises a conductive end case body. The drive shaft rotates and is rotatably installed in the end case body. One end of the drive shaft penetrates out from the end case body and is fixedly connected with one end of the target. An end seal portion is installed at the other end of the target, and the end seal portion is in relative rotational fit with the other end of the target, or the end seal portion rotates with the target.

A conductive central support is also fixed in the end case body. A connection shaft is fixedly connected to the center of the central support. The connection shaft passes through the drive shaft, and the end of the connection shaft is fixedly connected with one end of a bar magnet inside the target. The electrical contact is non-rotatably sleeve on the connection shaft, and the electrical contact is electrically connected with the central support. The external power supply is connected to the target through the end case body, the central support, the electrical contact, and the drive shaft.

The electrical contact and the central support are connected by several conductive bands.

A spring is set on the connection shaft between the electrical contact and the central support, to provide force through the spring to maintain the cone surface of the electrical contact with the conical hole portion of the drive shaft in electrically contact.

The connection shaft is hollow. A hole on one side of the central support is communicated with the interior of the connection shaft. There is a circular gap between the outer wall of the connection shaft and the inner wall of the drive shaft. A first channel is configured in the wall of the drive shaft, one end of which is communicated with the circular gap between the connection shaft and the drive shaft, and the other end of which is communicated with the interior of the target. A second channel is configured in the end seal portion, one end of which is communicated with the interior of the target, and the other end of which is communicated with the interior of the hollow bar magnet, and the interior of the bar magnet is also communicated with the interior of the connection shaft. A pair of water joints are installed on the end case body. One of the water joints is communicated with the circular gap between the connection shaft and the drive shaft, and the other one of the water joint is communicated with the hole on the side of the central support.

A cycle gap is arranged between the inner wall of the end case body and the drive shaft. A vacuum rotary dynamic seal is fixed at one end of the cycle gap, and a cooling water dynamic seal is fixed at the other end of the cycle gap. The cycle gap between the end case body and the drive shaft is sealed by the vacuum rotary dynamic seal and the cooling water dynamic seal.

The drive shaft is wound with a belt, which is penetrated out from the end case body and connected to an external pulley.

In this application, the drive shaft and the electrical contact are matched by conical contact, and both of which are made of conductive metal materials. The pre-tightening force of the spring is used to closely contact between the cone surface of the electrical contact and the conical hole portion of the drive shaft. The electrical contact is used as the input of electric power, and the drive shaft and the target are connected to rotate synchronously. Because the contact area of the cone is much larger than that of the plane, it can transmit a larger current, the dynamic rotation of the target can be realized. And the taper has good guidance, and the contact surface will not be partially worn. The friction surface of the two is in the flowing cooling water, and the heat generated will be taken away by the cooling water in time.

Wherein the electrical contact is made of wear-resistant metal, such as copper, etc. The wear amount is smaller than that of the carbon brush, and the life of the electrical contact is long. The drive shaft and its conical hole portion are made of metal with higher hardness. In addition, the cooling water in the application can flow to the rotating surface between the drive shaft and the electrical contact through the circumferential gap between the drive shaft and the electrical contact, and the material generated by the wear will also be taken away by the cooling water without pollution.

In this application, the dynamic transmission of electric power, the dynamic seal of cooling water and the vacuum dynamic seal are all integrated on the end case body. The other end of the target can be fixed with an end seal portion, which rotates with the target, thus the target is formed into a cantilever rotating structure. Or, the other end of the target is relatively rotated and installed on the end seal portion, and the end seal portion is fixed, which can also make the target form a rotating structure. No matter what kind of rotating structure, it is only necessary to introduce cooling water, seal, drive and electrically connect at the end case body, which simplifies the overall structure.

Compared with the existing technology, the advantages of this application are larger transmission power and more reliable structure.

DRAWINGS

DETAILED DESCRIPTION OF THE EMBODIMENTS

Refer to FIG. 1-4, a rotary cathode end block in this application embodiment is used to rotate a hollow target 26 and electrically connect it to an external power supply when the target 26 rotates. There is a bar magnet 25 inside the target 26, which is hollow to provide the magnetic force required for magnetron sputtering.

Figure 1:
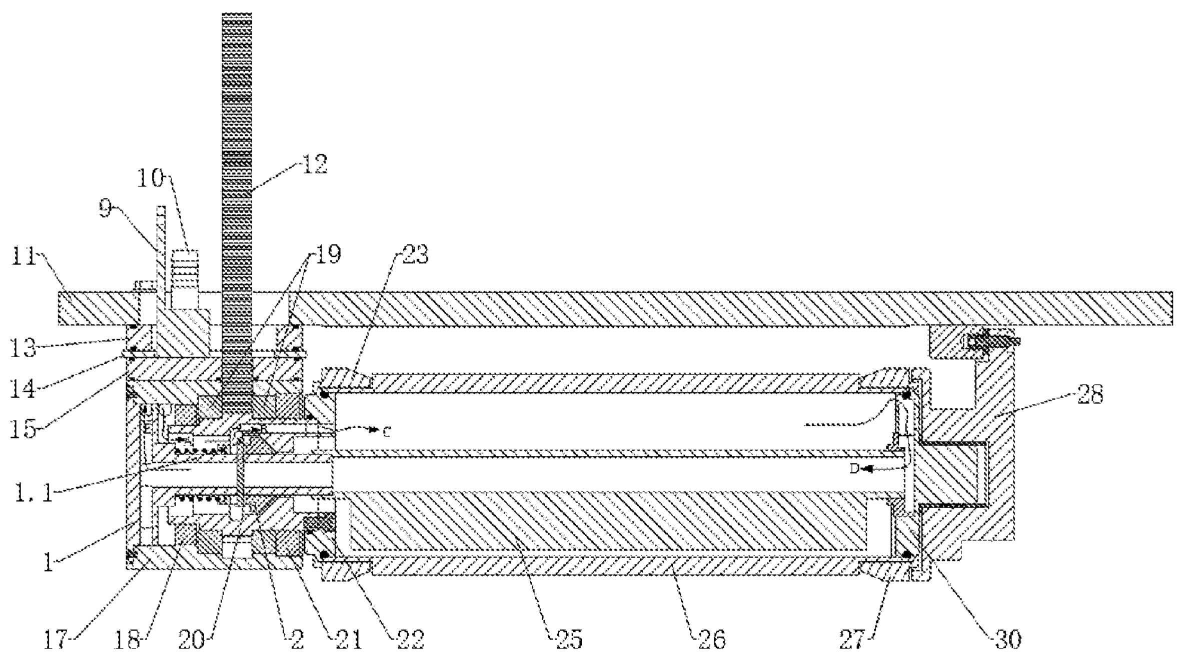
FIG. 1 is a schematic diagram of the structure of the rotary cathode end block of an example in this application.

As shown in FIG. 1, the embodiment is fixed at the bottom of a workbench 11 (the workbench 11 can also be called a cover plate or a door plate), comprising a conductive end case body 17. The end case body 17 is a barrel with the axis arranged horizontally in the left and right directions, and both ends of which have openings. The top of the end case body 17 is fixed with a conductive plate 15 by mounting screws, the conductive plate 15 is fixed with an insulating plate 14, the insulating plate 14 is fixed with an end base 13, and the end base 13 is fixed at the bottom of the workbench 11 by connecting screws. The conductive plate 15 is electrically connected and fixed with a receiving block 9, which is electrically connected with the external power supply through the insulating plate 14, the end base 13 and the workbench 11 in turn. There are also two water joints 10 fixed on the end case body 17. The upper ends of the two water joints 10 are connected to the external water source through the conductive plate 15, the insulation plate 14, the end base 13 and the workbench 11 in turn.

Two bearings 19 are coaxially installed inside the end case body 17 and are distributed left and right. Specifically, the outer ring of the bearing 19 is fixed on the inner wall of end case body 17. A drive shaft 20 is coaxially and rotatably installed in the end case body 17 through the bearing 19, and the drive shaft 20 is conductive. Specifically, part of the shaft body of the drive shaft 20 is fixed on the inner rings of two bearings 19. There is a cycle gap between the drive shaft 20 and the end case body 17. The left end of the cycle gap is fixed with a cooling water dynamic seal 18 set outside the drive shaft 20, and the right end of the gap is fixed with a vacuum rotary dynamic seal 21 set outside the drive shaft 20. The cycle gap between the end case body 17 and the drive shaft 20 is sealed by the cooling water dynamic seal 18 and the vacuum rotary dynamic seal 21. The shaft body of the drive shaft 20 located between two bearings 19 is wound with a belt 12. The belt 12 is connected to an external pulley driven by an external motor through the end case body 17, the conductive plate 15, the insulation plate 14, the end base 13 and the workbench 11 in turn, so that the drive shaft 20 is driven to rotate by the external motor through the belt 12.

It is worth mentioning that the drive shaft 20 can also be driven by other methods that can be obtained by technicians in this field without paying creative work. For example, the rotation of the drive shaft 20 can be driven by external motor linkage gear transmission.

The right end of the drive shaft 20 is fixedly connected with a target installation flange 22 penetrating from the right side of the end case body 17. A first target locking clamp 23 is installed on the outer edge of the target installation flange 22 by elastic rotation. The axial direction of the target 26 is arranged horizontally in the left and right directions. The target 26 is hollow and both ends of which have openings. The target installation flange 22 connected to the right end of the drive shaft 20 is installed in the left end opening of the target 26, plugging the opening, and clamping the outer edge of the left end opening of the target 26 through the first target locking clamp 23 to form fixed. A conical hole portion 20.1 is formed on the right side of the drive shaft 20, and the left side of the conical hole portion 20.1 is a conical inner hole. A first channel is formed on the right shaft wall of the drive shaft 20, and the left end of the first channel is communicated with the drive shaft 20 on the left side of the conical hole portion 20.1. There is a left and right through hole in the target installation flange 22, and the right end of the first channel is communicated with the left end hole 1.2 of the target installation flange 22. The right end hole 1.2 of the target installation flange 22 is communicated with the left end opening of the target 26. Therefore, the interior of the drive shaft 20 is communicated with the interior of the target 26 through the first channel and the hole of the target installation flange 22.

As shown in FIG. 1, a support end 28 is fixed at the bottom of the workbench 11 corresponding to the right end opening position of the target 26. A head 30 is installed and sealed in the right end opening of the target 26. The head 30 is rotated and installed on the support end 28. And the outer edge of the head 30 is elastically rotated and installed with a second target locking clamp 27. The outer edge of the right end opening of the target 26 is clamped by the second target locking clamp 26 to form fixed. At this time, the end seal portion of the right end of the target 26 is formed by the support end 28, the head 30 and the second target locking clip 27, and the end seal portion and the right end of the drive shaft 20 cooperate to support the rotation of the target 26.

The head 30 is hollow to form a second channel. One end of the second channel is communicated with the interior of the target 26, and the other end of the second waterway is set in the central of the head 30 to form a central hole. A bar magnet 25 inside the target 26 is also arranged horizontally in the left and right directions, and the left and right ends of the bar magnet 25 are provided with openings. The right end of the bar magnet 25 can be rotated and mounted in the central through hole of the head 30, thereby forming a support for the right end of the bar magnet 25. And the bar magnet 25 is communicated with the second channel in the head 30 through its right end opening, and then communicated with the interior of the target 26 through the second channel.

Figure 2:
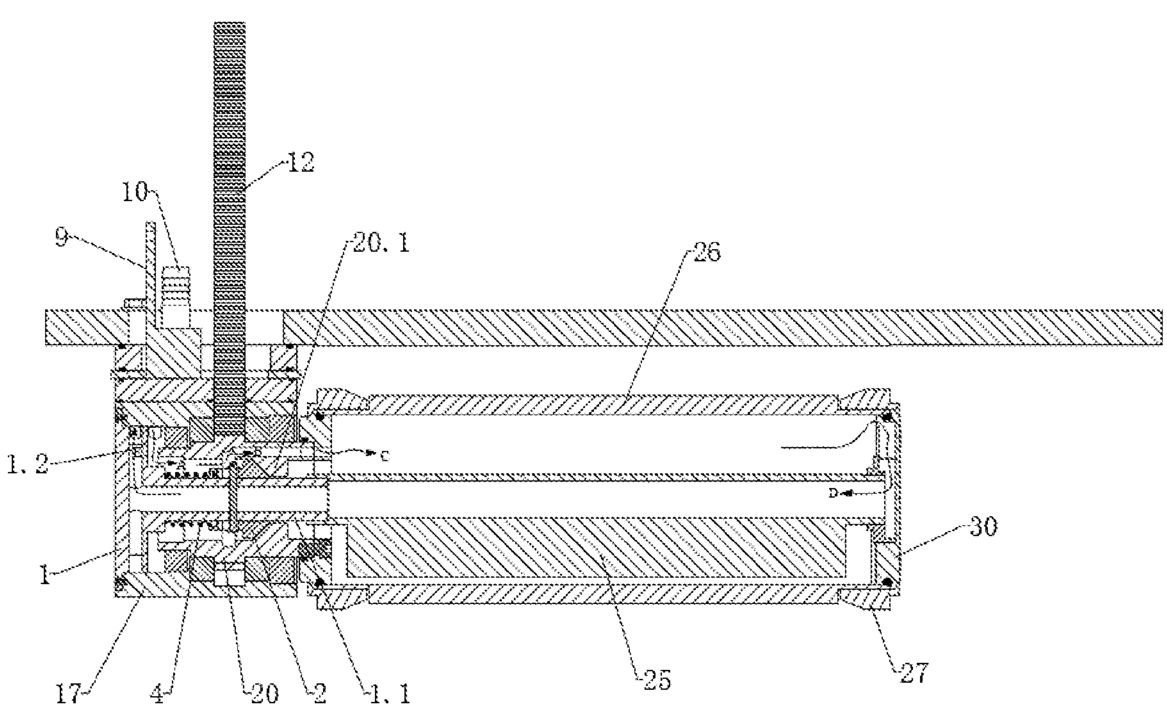
FIG. 2 is a schematic diagram of the structure of the rotary cathode end block of another example in this application.

As an alternative embodiment, as shown in FIG. 2, the difference is the elimination of the support end 28, and only a head 30 with a second channel inside is plugged into the right end opening of the target 26. Therefore, the cantilever structure of the target 26 can be formed by supporting and fixing the target 26 only at the left end of the target 26.

Figure 3:
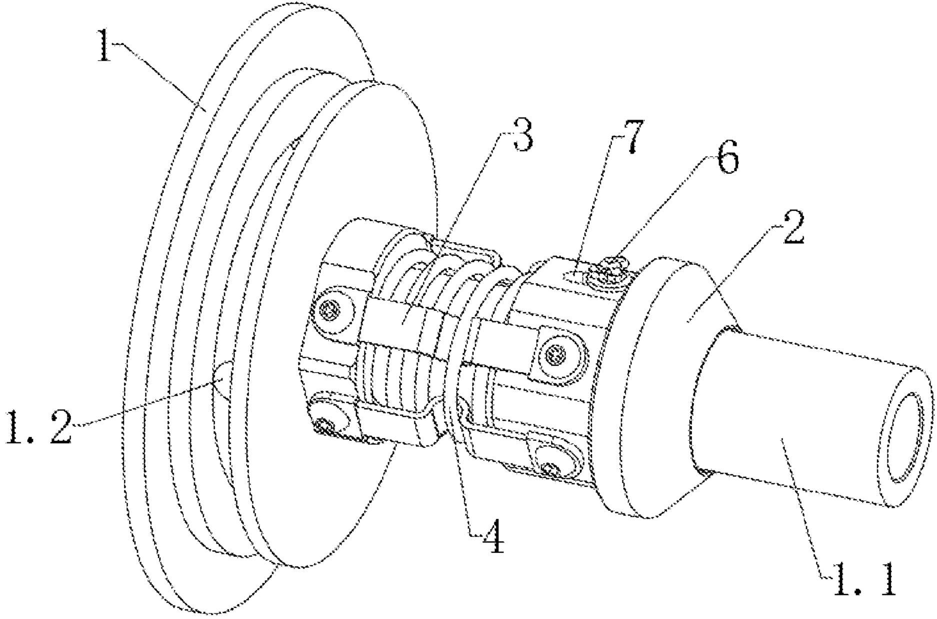
FIG. 3 is an assembly structure diagram of the central support and the electrical contact in this application.

As shown in FIG. 3, a conductive central support 1 is coaxially fixed in the left opening of the end case body 17, and the right side of the central support 1 is coaxially shaped with a connection shaft 1.1. The connection shaft 1.1 is hollow, and the right end of the connection shaft 1.1 is an opening. And the right end opening of the connection shaft 1.1 penetrates coaxially to the right through the drive shaft 20 and its conical hole portion 20.1, and then passes through the target installation flange 22 and is inserted into the left end opening of the bar magnet 25, thus not only forming a support for the left end of the bar magnet 25, and also making the opening at the left end of the magnet 25 communicated with the interior of the connection shaft 1.1. The side of the central support 1 is provided with a hole 1.2, one end of the hole 1.2 is communicated with the interior of the connection shaft 1.1, and the other end is communicated with the interior of the end case body 17.

An electrical contact 2 is coaxially sleeved on the connection shaft 1.1, and the right end of the electrical contact 2 is set with a conical surface. There are multiple conductive belts 3 between the central support 1 and the electrical contact 2. One end of each conductive belt 3 is fixed on the central support 1 by fastening screws, and the other end is fixed on the electrical contact 2 by fastening screws, and each conductive belt 3 has a certain elastic deformation. A spring 4 is sleeved on the connection shaft 1.1 and is between the electrical contact 2 and the central support 1. One end of the spring 4 is contacted or fixed on the surface of the central support 1, and the other end of the spring 4 is contacted or fixed on the left end of the electrical contact 2. The conical surface at the right end of the electrical contact 2 matches the shape of the conical hole wall in the conical hole portion 20.1 of the drive shaft 20, and the conical surface at the right end of the electrical contact 2 maintains electric contact with the conical inner hole wall in the conical hole portion 20.1.

As a priority technical solution, the electrical contact 2 is located on the drive shaft 20, which can save space and make the structure compact. The technicians in this field can understand that as long as the electric contact 2 and the drive shaft 20 are in contact with each other through the conical surface, the purpose of increasing the transmission current can be achieved. In the specific embodiment, the specific location of the contact between the electrical contact 2 and the drive shaft 20 can also be implemented in other ways. For example, the end of the electrical contact 2 can be contacted with the end of the drive shaft 20, one end of which is a convex conical surface, and the other end is a concave conical hole, which can also achieve the effect of contact through the conical surface.

Figure 4:
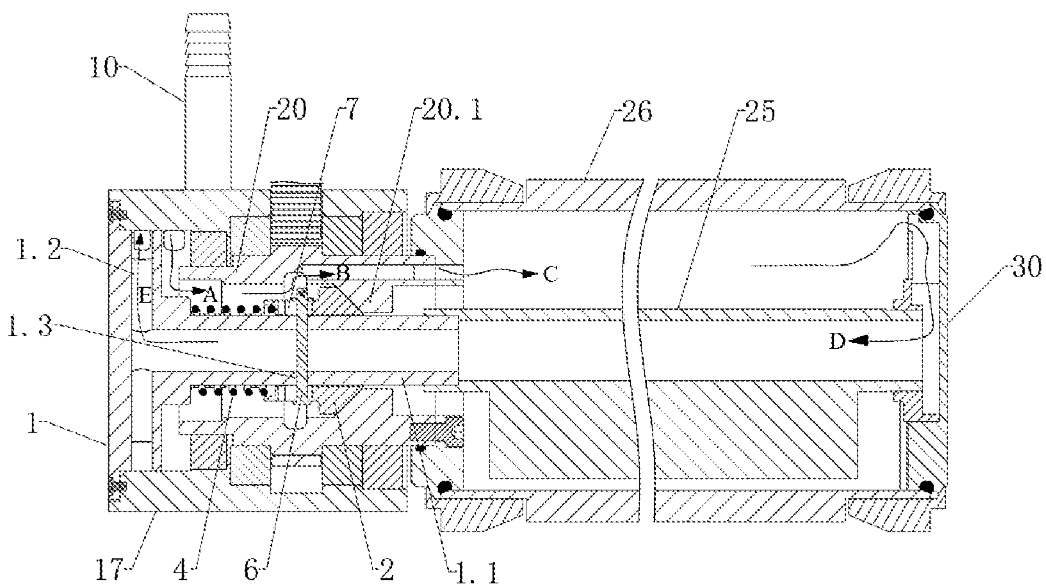
FIG. 4 is a local schematic diagram of the rotary cathode end block in this application.

Refer to FIG. 4, in order to make the electrical contact 2 on the connection shaft 1.1 non-rotating, the connection shaft 1.1 is provided with a pin hole 1.3 along its radial direction. The connection shaft 1.1 is fitted with a spacing pin 6 through the pin hole 1.3, and both ends of which are extended from the pin hole 1.3. The electric contact 2 is provided with a guide groove 7 along its axial direction. The electric contact 2 can slide through the guide groove 7 and the spacing pin 6 protruded from both ends of the pin hole 1.3. Therefore, the spacing pin 6 can make the electrical contact 2 unable to rotate on the connection shaft 1.1, thus avoiding the electrical contact 2 to rotate under the action of friction when the drive shaft 20 rotates.

As another alternative implementation method, the side wall of the electrical contact is provided with a pin hole. There are threads on the inner wall of the pin hole, a spacing pin is screwed in the pin hole, and there is a flat pad between the nail cap of the spacing pin and the pin hole. The nail head of the spacing pin presses the corresponding position of the outer wall of the connection shaft, so that the electrical contact can not rotate on the connection shaft through the spacing pin, so as to avoid the rotation of the electrical contact under the action of friction when the electrical contact contacts with the conical hole of the drive shaft.

In the embodiment of this application, when the drive shaft 20 rotates, the target 26 rotates, while the connection shaft 1.1, the electric contact 2, and the bar magnet 25 remain not rotating. During the rotation process, the target 26 forms an electrical connection with the receiving block 9 through the drive shaft 20, the electrical contact 2, the central support 1, the end case body 17, and the conductive plate 15, and then the external power supply is electrically connected through the receiving block 9.

Therefore, in this embodiment, the cable of the power supply for the cathode is connected to the connecting block 9. The current is statically transmitted to the electrical contact 2 through the connecting block 9, the conductive plate 15, the end case body 17, the central support 1, and the conductive band 3 in turn. The working process of the above components is in a static state. In the working project, the driving part drives the belt 12, and the belt 12 drives the drive shaft 20 to rotate. The conical surface of the drive shaft 20 and the conical surface of the electrical contact 2 cooperate to realize the dynamic rotation and transmission of the electric power from the conical electric contact 2 to the drive shaft 20. The drive shaft 20 is fixedly connected with the target installation flange 22, and the target installation flange 22 is connected with the target 26, so as to realize the dynamic rotation transmission of electric power to the target 26.

In this embodiment, the cone angle of the cone electrical contact 2 and the drive shaft 20 can be any angle according to the size of the space, so as to increase the rotating contact area of the electric power and the guiding and positioning function of the electrical contact 2.

In the left direction of the conical hole portion 20.1, there is a circumferential gap between the outer wall of the connection shaft 1.1 and the inner wall of the drive shaft 20. The left end of the first channel in the drive shaft 20 is specifically communicated with the circumferential gap on the left side of the conical hole portion 20.1.

In the two water joints 10 on the end case body 17, the lower end of one water joint 10 is communicated with the circumferential gap through the inside of the end case body 17, and the lower end of the other water joint 10 is communicated with the side hole 1.2 of the central support 1 through the inside of the end case body 17, thus forming a water circulation.

In this embodiment, the cooling water enters the circumferential gap between the connection shaft 1.1 and the drive shaft 20 through one of the water joints 10 (as shown in path A in FIG. 3), and then enters the first channel of the drive shaft 20 from the circumferential gap (as shown in path B in FIG. 3), and then enters the interior of the target 26 from the through hole of the target installation flange 22 (as shown in path C in FIG. 3), and then enters the interior of the bar magnet 25 through the second channel in the head 30 (as shown in path D in FIG. 3), and then enters the side hole 1.2 of the central support 1 through the interior of the connection shaft 1.1 (as shown in path E in FIG. 3). Finally, the side hole 1.2 of the central support 1 enters another water joint 10, and the two water joints 10 are communicated with the external cooling water source, thus forming a circulating waterway of cooling water.

The technical personnel in this field can understand that two water joints 10 can be selected as one of the inlet end and the other as the outlet end. Therefore, when the two water joints 10 switch the inlet and outlet ends, the circulation direction of the cooling water will be opposite to the direction of the above path (A→B→C→D→E).

In this embodiment, the conical surfaces of the electrical contact 2 and the drive shaft 20 are both in the flow path of the cooling water, so the heat and wear-generated materials can be taken away by the cooling water.

In this embodiment, the cooling water dynamic seal 18 realizes the function of the dynamic rotating water seal of the cooling water channel and the bearing 19 located on the atmospheric side. The vacuum rotary dynamic seal 21 realizes the function of dynamic rotary vacuum seal with bearing 19 on the air side and target 26 on the vacuum side. The insulating plate 14 is prepared by a high-voltage-resistant insulating material to realize the insulation function between the end base 13 and the conductive plate 15.

The above is only the preferred embodiment of the present application, but the scope of protection of the present application is not limited thereto, and any equivalents or modifications of the technical solutions of the present application and the application concept thereof should be comprised in the scope of the present application within the scope of the technical scope of the present application.

What is claimed is:

1. A rotary cathode end block, comprising: an end case body, a conductive drive shaft is rotatably installed in the end case body through a bearing, and one end of the drive shaft penetrates from the end case body and is fixedly connected with a target installation flange;

a central support, fixedly connected to the end case body, the central support is integrally formed with a connection shaft, one end of the connection shaft coaxially passes through the drive shaft and the target installation flange;

an electrical contact, coaxially set on the connection shaft, the central support is electrically connected with the electrical contact, the electrical contact is in contact with the drive shaft, and a contact surface between which is cone-shaped, wherein an end of the electrical contact is configured with a conical surface, a conical hole portion is formed inside the drive shaft, the electrical contact is arranged in the drive shaft, and the conical surface at the end of the electrical contact is in contact with the conical inner wall of the conical hole portion in the drive shaft.

2. The rotary cathode end block according to claim 1, a conductive band is connected between the central support and the electrical contact.

3. The rotary cathode end block according to claim 1, a spring between the electrical contact and the central support is set on the connection shaft, a force is provided through the spring to maintain close contact between the electrical contact and the drive shaft.

4. The rotary cathode end block according to claim 3, the connection shaft is configured with a pin hole along its radial orientation, a spacing pin is installed in the pin hole, both ends of the spacing pin are extended out from the pin hole; a guide groove is arranged on the electrical contact along its axial direction, the electrical contact slidable fits with the spacing pin through the guide groove.

5. The rotary cathode end block according to claim 1, the end case body is conductive, and the end case body is fixedly connected with a conductive plate, the conductive plate is fixedly connected with an insulating plate and a connecting block, the insulating plate is fixedly connected with an end base, the connecting block passes through the insulating plate and the end base.

6. The rotary cathode end block according to claim 5, the shaft body of the drive shaft is wound with a belt, and the belt is penetrated out from the end case body.

7. The rotary cathode end block according to claim 6, further comprising a workbench, the end base is fixedly connected to the workbench, and the belt and a connecting block pass through the workbench.

8. The rotary cathode end block according to claim 1, a vacuum rotary dynamic seal is installed between one end of the drive shaft penetrating out of the end case body and the end case body.

9. The rotary cathode end block according to claim 1, the outer edge of the target installation flange is installed with a first target locking clamp.

10. The rotary cathode end block according to claim 1, further comprising a head, for mounting at one end of the target;

two water joints fixedly connected on the end case body, a circumferential gap is provided between the drive shaft and the connection shaft, and one of the water joints is communicated with the circumferential gap, a first channel communicated with the circumferential gap is arranged on the drive shaft, and a through hole communicate with the first channel is arranged on the target installation flange; a second channel is provided in the head, and the connection shaft is a hollow shaft, a circumferential surface of the central support is provided with a hole communicated with the interior of the connection shaft, and the other one of the water joints is communicated with the hole, a cooling water dynamic seal is installed between one end of the drive shaft located inside the end case body and the inner wall of the end case body.

11. The rotary cathode end block according to claim 1, further comprising a head, for mounting at one end of the target; and an outer edge of the head is installed with a second target locking clamp.

12. The rotary cathode end block according to claim 1, further comprising a head, for mounting at one end of the target; and a support end, and the head can be rotated and installed on the support end.

13. A rotary cathode end block, used to rotate a target with a bar magnet inside and electrically connects to an external power supply, comprising a drive shaft, used to connect the target to drive the target to rotate, and the drive shaft is made of conductive material, and further comprising an electrical contact for electrical connection, one of the electrical contact and the drive shaft is formed with a conical hole portion, and the other one of the electrical contact and the drive shaft is formed with a conical surface, the electric contact between the electrical contact and the drive shaft is maintained by the conical surface and the conical hole portion, and the electrical contact does not rotate with the drive shaft, the external power supply is electrically connected to the target through the electrical contact and the drive shaft in turn.

14. The rotary cathode end block according to claim 13, the electrical contact and the drive shaft are made of conductive metal materials, and the material hardness of the drive shaft is greater than the material hardness of the electrical contact.

15. The rotary cathode end block according to claim 13, an end of the electrical contact is shaped with a conical surface, and the drive shaft is hollow and shaped with the conical hole portion, the electrical contact is arranged in the drive shaft, and the conical surface of the electrical contact is maintained electric contact with a wall of the conical hole portion of the drive shaft;

further comprising a conductive end case body, the drive shaft rotatably installed in the end case body, one end of the drive shaft penetrates out from the end case body and is fixedly connected with one end of the target, an end seal portion is installed at the other end of the target, and the end seal portion is in relative rotational fit with the other end of the target, or the end seal portion rotates with the target;

a conductive central support is fixed in the end case body, a connection shaft is fixedly connected to the center of the central support, the connection shaft passes through the drive shaft, and one end of the connection shaft is fixedly connected with one end of the bar magnet inside the target; the electrical contact is non-rotatably sleeve on the connection shaft, and the electrical contact is electrically connected with the central support, an external power supply is connected to the target through the end case body, the central support, the electrical contact, and the drive shaft.

16. The rotary cathode end block according to claim 15, the electrical contact and the central support are connected by several conductive bands.

17. The rotary cathode end block according to claim 15, a spring is set on the connection shaft between the electrical contact and the central support, a force is provided through the spring to maintain a cone surface of the electrical contact electrically contact with the conical hole portion of the drive shaft.

18. The rotary cathode end block according to claim 15, the connection shaft is hollow, a hole provided on one side of the central support is communicated with an interior of the connection shaft, a circular gap between an outer wall of the connection shaft and an inner wall of the drive shaft, a first channel is configured in an wall of the drive shaft, one end of the first channel is communicated with the circular gap between the connection shaft and the drive shaft, and the other end of the first channel is communicated with an interior of the target; a second channel is configured in the end seal portion, one end of the second channel is communicated with the interior of the target, and the other end of the second channel is communicated with an interior of the hollow bar magnet, and the interior of the bar magnet is also communicated with the interior of the connection shaft; a pair of water joints are installed on the end case body, one end of one of the water joints is communicated with the circular gap between the connection shaft and the drive shaft, and the other one of the water joints is communicated with the hole on the side of the central support.

19. The rotary cathode end block according to claim 15, a cycle gap is arranged between an inner wall of the end case body and the drive shaft, a vacuum rotary dynamic seal is fixed at one end of the cycle gap, and a cooling water dynamic seal is fixed at the other end of the cycle gap, the cycle gap between the end case body and the drive shaft is sealed by the cooling water dynamic seal and the vacuum rotary dynamic seal.

* * * * *